US008686757B2

(12) United States Patent
Ng et al.

(10) Patent No.: US 8,686,757 B2
(45) Date of Patent: Apr. 1, 2014

(54) APPARATUS AND METHOD FOR SELECTIVELY ENABLING AND DISABLING A SQUELCH CIRCUIT ACROSS AHCI AND SATA POWER STATES

(75) Inventors: Jien-Hau Ng, Perak (MY); Tea M. Lee, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 13/423,926

(22) Filed: Mar. 19, 2012

(65) Prior Publication Data
US 2012/0280719 A1 Nov. 8, 2012

Related U.S. Application Data

(63) Continuation of application No. 11/902,944, filed on Sep. 26, 2007, now Pat. No. 8,138,803.

(51) Int. Cl.
*H03K 5/22* (2006.01)
(52) U.S. Cl.
USPC .............................................. 327/63; 327/65

(58) Field of Classification Search
None
See application file for complete search history.

(56) References Cited

U.S. PATENT DOCUMENTS

| | | | |
|---|---|---|---|
| 7,424,628 B2 * | 9/2008 | Matsumoto et al. | 713/300 |
| 7,471,118 B2 * | 12/2008 | Liu | 327/58 |
| 7,724,645 B2 * | 5/2010 | Bedwani et al. | 370/216 |
| 8,036,595 B2 * | 10/2011 | Glass et al. | 455/41.1 |
| 2005/0254610 A1 * | 11/2005 | Liu et al. | 375/354 |
| 2006/0242312 A1 * | 10/2006 | Crespi et al. | 709/230 |

OTHER PUBLICATIONS

Notice of Allowance from U.S. Appl. No. 11/902,944 mailed Nov. 10, 2011, 9 pages.

* cited by examiner

*Primary Examiner* — Cassandra Cox
(74) *Attorney, Agent, or Firm* — Christopher K. Gagne

(57) ABSTRACT

An apparatus and a method are provided for selectively enabling and disabling a squelch circuit in a Serial Advanced Technology Attachment (SATA) host or SATA device while maintaining proper operation of the host and device. An apparatus and method are provided which allow the squelch circuit to be selectively enabled and disabled across SATA power states (PHY Ready, Partial, and Slumber) and in Advanced Host Controller Interface (AHCI) Listen mode.

36 Claims, 8 Drawing Sheets

A PPARATUS AND METHOD FOR
SELECTIVELY ENABLING AND DISABLING
A SQUELCH CIRCUIT ACROSS AHCI AND
SATA POWER STATES

This application is a continuation of, and claims the benefit of, application Ser. No. 11/902,944, filed Sep. 26, 2007, now U.S. Pat. No. 8,138,803.

FIELD OF THE INVENTION

The present invention generally relates to selectively enabling and disabling a squelch circuit within a Serial Advanced Technology Attachment (SATA) host or SATA device. In particular, the present invention relates to an apparatus and method for selectively enabling and disabling a squelch circuit within a SATA host or SATA device across SATA and AHCI power states.

BACKGROUND OF THE INVENTION

Serial ATA (SATA) is a storage interface standard (Serial ATA Specification, Revision 2.6, published February 2007) developed in 2003 to replace the aging Parallel ATA (PATA) standard. Serial ATA offers a number of advantages over Parallel ATA such as a faster data transfer rate due to differential signaling. SATA controllers may also include a standard interface known as the Advanced Host Controller Interface (AHCI). AHCI (AHCI Revision 1.2, ratified April 2007) enables several advanced features such as hot swapping and Native Command Queuing. In 2004 the SATA interface was expanded to include external SATA (eSATA) to allow SATA devices to be deployed in external enclosures with minimal modification (the eSATA specification is included in the Serial ATA Specification, Revision 2.6).

The SATA interface defines the connection between a SATA host adapter and a SATA device adapter. A host may be for example a computer, a laptop, a server, or a device that can connect to a storage medium. A device may be a hard disk drive, a memory, a DVD drive, a CD drive, or any device, co-located with the host or not, that utilizes a storage medium. The SATA adapter includes an Analog Front End (AFE) which acts as an interface between the SATA adapter's processor and the physical medium. The AFE converts analog differential data signals received over the physical medium to digital data signals which it transmits to the adapter's processor. The AFE also converts digital data signals received from the adapter's processor to analog differential data signals which it transmits over the physical medium.

FIG. 1 shows a typical connection between a SATA host AFE 100 and a SATA device AFE 110. The SATA interface connection includes digital data signals TX data and RX data and analog differential data signals TX+/TX− and RX+/RX−. The SATA interface connection also includes signals Com-Wake, ComInit, and ComReset which are Out Of Band (OOB) signals. OOB signals are transmitted over the same signal lines as data, but have unique characteristics that differentiate them from normal data signals and allow the SATA interface to distinguish between OOB signals and normal data signals. The AFE may include a squelch circuit, an Out Of Band signal detector circuit, or other circuitry to distinguish between data signals and OOB signals.

According to the SATA specification, OOB signals are used in three instances: to initialize communication with a host, to bring a device or host out of a power-down mode or to force a hard reset in a device. When compared to normal data signals, OOB signals are used very infrequently. Despite this fact, the SATA and AHCI specifications require that the squelch circuit and OOB detector circuit are constantly powered and activated. In fact, no current apparatus or method exists to allow the power down and deactivation of these circuits while maintaining proper SATA host and device operation.

BRIEF DESCRIPTION OF THE DRAWINGS

Embodiments of the invention will be understood and appreciated more fully from the following detailed description in conjunction with the drawings in which like reference numerals indicate corresponding, analogous or similar elements, and in which.

DETAILED DESCRIPTION

Figure 1:
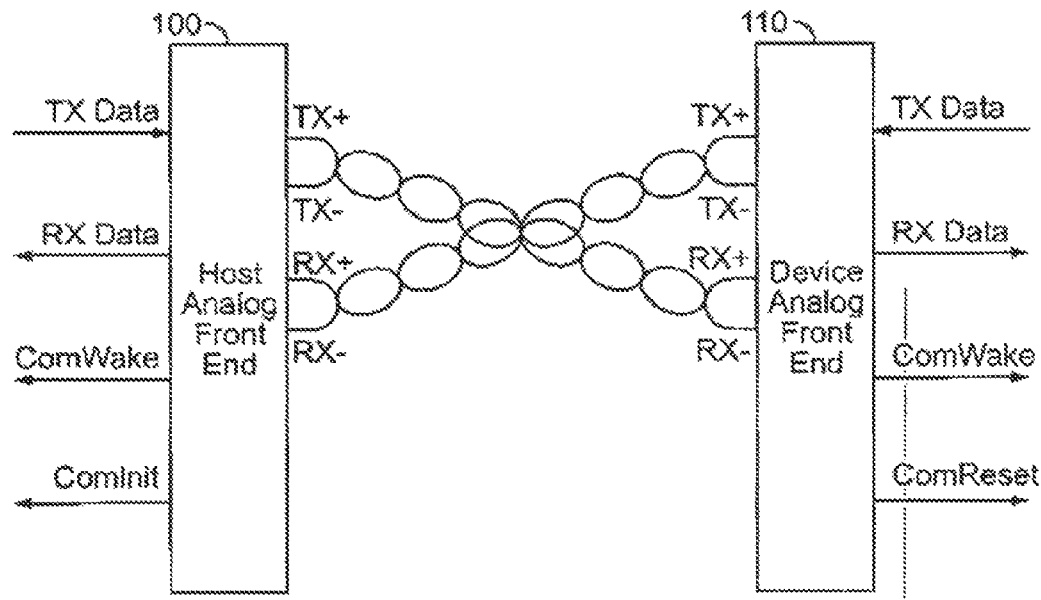
FIG. 1 shows a typical connection between a SATA host AFE and a SATA device AFE.

In the following description, various aspects of the present invention will be described. For purposes of explanation, specific configurations and details are set forth in order to provide a thorough understanding of the present invention. However, it will be apparent to one skilled in the art that the present invention may be practiced without the specific details presented herein. Furthermore, well-known features may be omitted or simplified in order not to obscure the present invention. Various examples are given throughout this description. These are merely descriptions of specific embodiments of the invention. The scope of the invention is not limited to the examples given.

Unless specifically stated otherwise, as apparent from the following discussions, it is appreciated that throughout the specification, discussions utilizing terms such as "processing," "computing," "calculating," "determining," or the like, refer to the action and/or processes of a processor, computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computer, communication device or other apparatus. Embodiments of the present invention are not described with reference to any particular programming language, machine code, or the like.

Embodiments of the present invention may include a computer program stored in a computer readable storage medium, such as, but is not limited to, any type of disk including floppy disks, optical disks, magnetic-optical disks, read-only memories, compact disc read-only memories, random access memories, electrically programmable read-only memories, electrically erasable and programmable read only memories, magnetic or optical cards, or any other type of media suitable for storing electronic instructions, and capable of being coupled to a computer system bus.

Embodiments of the present invention may include digital logic signals. These logic signals may be described as having a certain logic level, for example, logic '1' or logic '0'. As is understood by those skilled in the art, this is done merely for illustrative purposes to clarify an embodiment of the invention and is not meant to indicate that only the indicated logic level is operable. For example, if a circuit has an input which is used to enable the circuit, the input signal may be described as being logic '1' to enable the circuit and logic '0' to disable the circuit. However, those skilled in the art will recognize that this is true only if the circuit's enable input is active-high. In another embodiment, the circuit's enable input may be active-low in which case a logic '0' input will enable the circuit and a logic '1' will disable the circuit. Because such alternatives are well-known by those skilled in the art, only a single embodiment may be described herein. However, other embodiments having different logic levels are considered a part of the present invention.

In one embodiment a squelch circuit may be selectively enabled and disabled while maintaining proper operation of the SATA host or device. The squelch circuit may be selectively enabled and disabled during any SATA link power state (e.g., PHY Ready, Partial, or Slumber). The squelch circuit may be selectively enabled and disabled during AHCI Listen mode. Enabling and disabling the squelch circuit may include enabling and disabling an OOB detection circuit. Enabling and disabling the squelch circuit and/or the OOB detection circuit may result in a power saving for the SATA host or device. In embodiments in which the squelch circuit is enabled or disabled, it is to be understood that the OOB detection circuit may also be enabled or disabled.

A squelch circuit may be enabled and disabled when a SATA link is in the PHY Ready power state. The squelch circuit may also be enabled and disabled when the SATA link is in Listen mode if the SATA link contains a device or circuit which enables SATA devices to be removed or inserted when the SATA link is in Listen mode. An example of such a device is the Low Power Device Detection (LPDD) circuit. The term "LPDD" may refer to any device or method which allows SATA devices to be removed or inserted when the SATA link is in Listen mode.

In another embodiment, a squelch circuit may be enabled and disabled when a SATA link is in the Partial or Slumber power management states, or in AHCI Listen mode when the SATA link does not contain LPDD or in which LPDD is not enabled.

An OOB detection circuit refers to circuitry used to detect the presence of Out Of Band signals by detecting OOB bursts, idle periods characterized by common mode voltage between OOB bursts, or both. The OOB detection circuit may further indicate the type of OOB signal detected (ComWake, ComInit, or ComReset). Alternately, all of these functions may be implemented in the squelch circuit.

Out Of Band signals are transmitted over the same signal lines as data, but have unique characteristics that differentiate them from normal data signals and allow the SATA interface to distinguish between OOB signals and normal data signals. OOB signals are characterized by OOB bursts separated by idle periods (e.g., gaps) at common mode voltage. An OOB burst is defined by starting at common mode voltage followed by a series of ALIGN primitives (or Dwords composed of D24.3 characters) and ending at common mode voltage. The ComReset signal originates from the host and forces a hard reset in the device. The ComInit signal originates from the device and requests a communication initialization from the host. The ComInit signal is electrically identical to the ComReset signal. The ComWake signal may originate from either the host or the device and is used to bring the receiver of the ComWake out of a power-down state (Partial or Slumber). The SATA specification defines three power states: PHY Ready, Partial, and Slumber. The PHY Ready state is defined as being fully powered. The Partial and Slumber power states are defined as power-down states in which the Partial state uses less power than the PHY Ready state, but more than the Slumber state. The AHCI specification defines an additional power-down state known as Listen mode.

Figure 2:
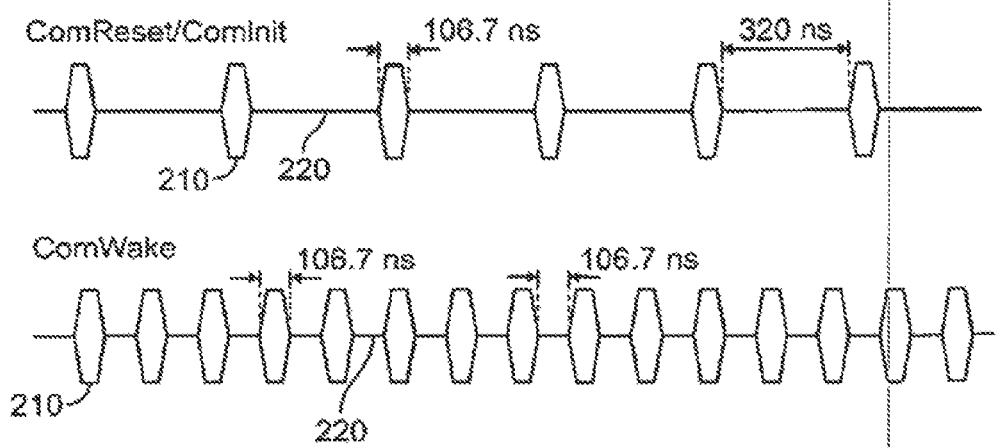
FIG. 2 shows a diagram of the differing transmission time lengths of both ALIGN primitives and idle periods for the three Out Of Band signals.

FIG. 2 shows a diagram of the differing transmission time lengths of both ALIGN primitives 210 and idle periods 220 for the three Out Of Band signals. The time values for ALIGN primitives 210 and idle periods 220 shown in FIG. 2 are nominal values. The SATA specification details a range of acceptable values for these parameters.

As mentioned above, the idle periods are characterized by transmission of a common mode voltage. In a differential signaling system, the positive and negative signal lines are typically at opposite voltage levels. For example, to transmit a logic '1' the positive signal line may be +250 mV and the negative signal line may be at −250 mV giving a differential voltage of 500 mV (which is interpreted by the receiver as a logic '1'). A differential signaling system is said to be at common mode when both the positive and negative signal lines are at substantially the same voltage (the common mode voltage) such that the differential voltage is substantially 0V. Alternatively, common mode may be defined as the differential voltage being below a threshold. At the common mode voltage, a logic level is not well-defined. Thus, a receiver receiving a common mode voltage may produce random bits at its output.

Figure 3:
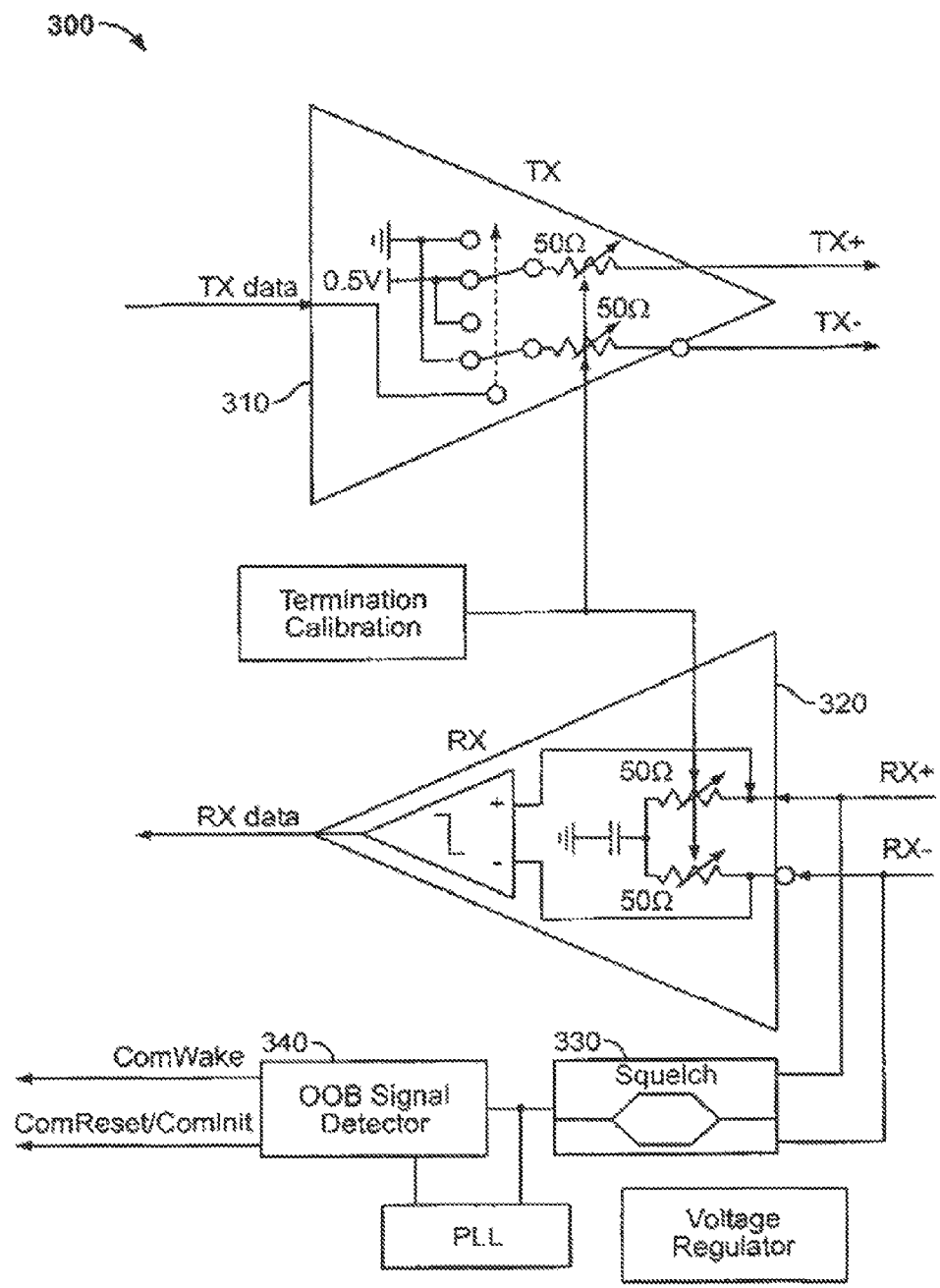
FIG. 3 shows a diagrammatic view of the circuitry which makes up an exemplary Analog Front End of a SATA host or SATA device.

FIG. 3 shows a diagrammatic view of the circuitry which makes up an exemplary Analog Front End 300 of a SATA host or SATA device. The AFE includes a transmitter 310, a receiver 320, a squelch circuit 330, and an Out Of Band signal detector circuit 340. The AFE may include other circuit elements as well or may include less circuit elements than shown. A squelch circuit may detect the presence of common mode signals. A squelch circuit may also detect signaling levels based on predetermined thresholds. For example, a differential voltage less than 50 mV may be considered common mode. A differential voltage above 200 mV may be considered a valid OOB signal. A differential voltage between 50 mV and 200 mV may be undetermined. An OOB signal detector circuit may detect the presence of Out Of Band signals, and may indicate the type of OOB signal detected.

Figure 4:
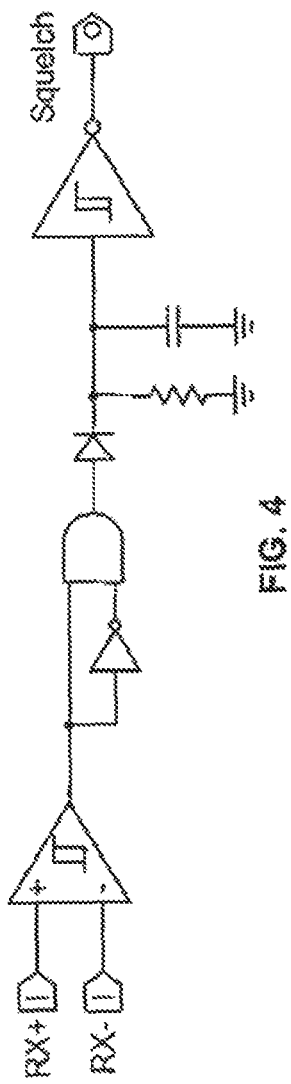
FIG. 4 shows a diagrammatic view of the circuitry which makes up an exemplary squelch circuit.
Figure 5:
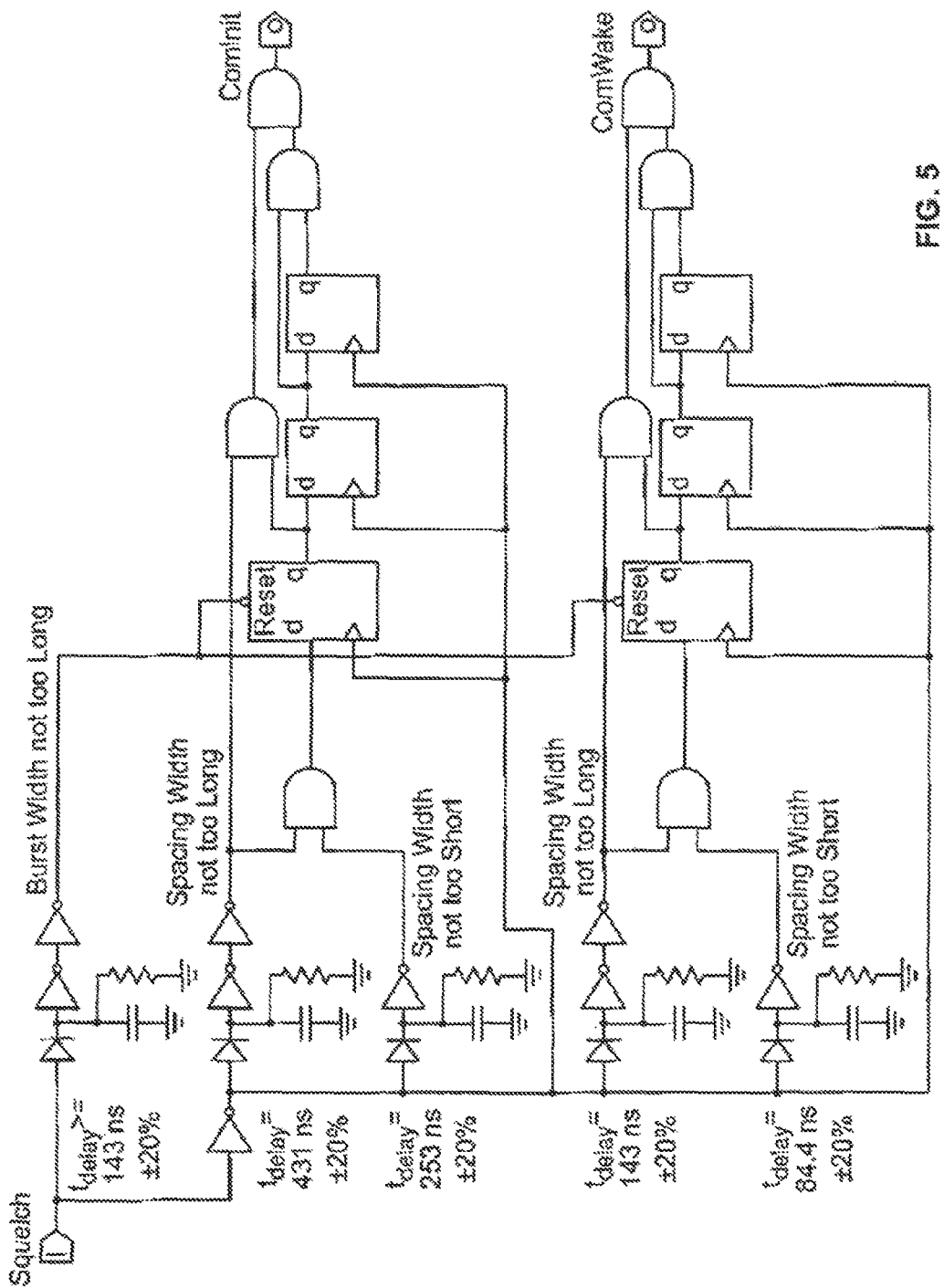
FIG. 5 shows a diagrammatic view of the circuitry which makes up an exemplary OOB detector circuit.

The OOB signal detector circuit may use an output from the squelch circuit to aid in detecting OOB signals. FIG. 4 shows a diagrammatic view of the circuitry which makes up an exemplary squelch circuit 330. The squelch circuit may include other circuit elements as well or may include less circuit elements than shown. FIG. 5 shows a diagrammatic view of the circuitry which makes up an exemplary OOB detector circuit 340. The OOB detector circuit may include other circuit elements as well or may include less circuit elements than shown.

Figure 6:
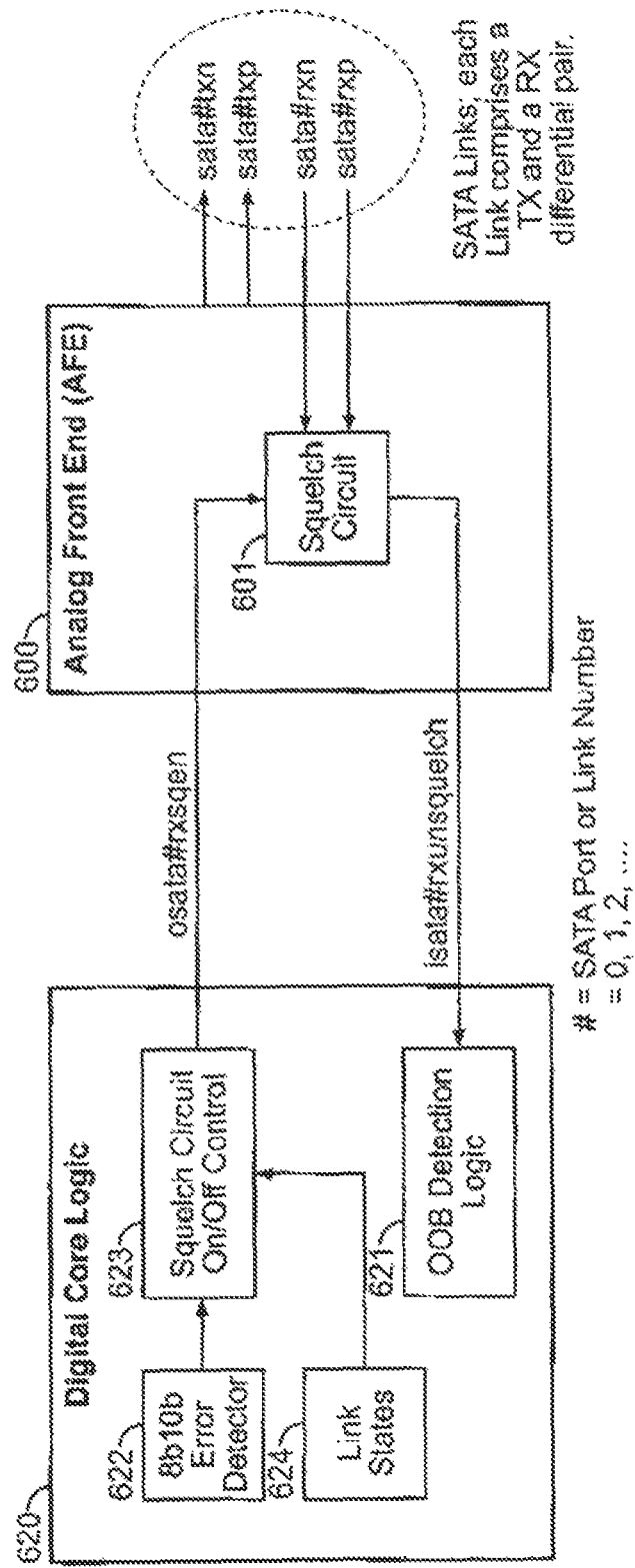
FIG. 6 shows a sub-block within an AFE and an embodiment of a sub-block within a Digital Core Logic for a single SATA link according to an embodiment of the invention.

FIG. 6 shows an embodiment of a sub-block 600 within an AFE and an embodiment of a sub-block 620 within a Digital Core Logic for a single SATA link. A SATA link refers to a single connection between a SATA host and a SATA device. In other embodiments of the invention, the same sub-blocks or circuitry may be used for all SATA links. Although circuits or functions are depicted in FIG. 6 as belonging to one of the two sub-blocks, it is to be understood that the circuits or functions may belong to the other of the two sub-blocks or may be spread across both sub-blocks. The Digital Core Logic may be implemented within a processor, controller, or other logic device integral to or connected to the SATA host's or device's adapter. Several signals depicted in FIG. 6 contain the "#" symbol in the signal name. The "#" symbol may represent the SATA link number (0 through L). Thus, sata#rxn would be written as sata0rxn to represent the satarxn signal for SATA link number 0.

Squelch circuit 601 may be enabled when the osata#rxsqen signal is at a logic '1' level and may be disabled when the osata#rxsqen signal is at a logic '0'. When the squelch circuit is enabled, it monitors received differential signals sata#rxn and sata#rxp. When the squelch circuit detects an OOB signal, the squelch circuit may output a digital logic '1' pulse on the isata#rxunsquelch signal which may be transmitted to OOB Detection Logic 621. When the squelch circuit is disabled, the isata#rxunsquelch signal may remain at logic '0'. Thus, once the squelch circuit is disabled, OOB signals may not be detected.

Digital Logic Core 620 may also include an 8b10b Error Detector 622, a Squelch Circuit On/Off Control 623 and a Link State Timer 624.

The 8b10b Error Detector may detect encoding errors in the 8b10b words received over the SATA link. SATA employs 8b10b encoding which maps 8 bit words into 10 bit symbols. When a common mode voltage is received, the receiver may interpret this unknown differential voltage state into random logic '1's and logic '0's. There is a high likelihood that these random bits will not represent properly encoded 8b10b symbols. When bits are received that are not properly encoded 8b10b symbols, the 8b10b Error Detector may assert an error signal indicating an 8b10b error has occurred. Although the 8b10b Error Detector may not contain sufficient circuitry to determine definitively if an OOB signal has been transmitted or even what type of OOB signal has been transmitted, the 8b10b error signal may be a useful method of anticipating a potential OOB signal. A potential OOB signal as indicated by the 8b10b Error Detector is known as an anticipated OOB signal. There may be one 8b10b Error Detector per SATA link.

The Squelch Circuit On/Off Control may assert or unassert the osata#rxsqen to enable or disable a SATA link's squelch circuit. After the osata#rxsgen signal is asserted, it may take some time for the squelch circuit to stabilize and be fully operational. There may be one Squelch Circuit On/Off Control per SATA link.

The Link State Timer may assert the sqckt#suppress signal which when asserted causes the Squelch Circuit On/Off Control to disable the SATA link's squelch circuit (i.e. the osata#rxsqen signal is forced to logic '0'). The Link State Timer may monitor the SATA link's power state (PHY Ready, Partial, and Slumber) and whether the SATA link is in AHCI Listen mode. The Link State Timer also may monitor whether a Low Power Device Detection circuit is enabled. The Link State Timer may also include a timer. There may be one Link State Timer per SATA link or one Link State Timer common to all SATA links.

The timer in the Link State Timer counts X time. In an embodiment of the present invention, X may be programmable. However, X must be larger than the longest gap between OOB bursts to prevent the timer from expiring prematurely between two OOB bursts. In one embodiment, X may be 1.92 µs. The timer is reinitialized whenever a SATA link enters the PHY Ready state or as long as an 8b10b error is detected in the PHY Ready state. Once the timer has completed being reinitialized, the timer starts counting down until it has expired (e.g., X time has elapsed since it was last reinitialized).

The sqckt#suppress signal is asserted to logic '1' (causing the osata#rxsqen signal to become logic '0' thereby shutting down the squelch circuit of a particular link) under any of the following conditions:

a. The communication link has not been established (the link is not in the PHY Ready state), the link is in AHCI Listen mode and an LPDD feature is enabled; or b. The communication link has been established (the link is in the PHY Ready state), no OOB signal is anticipated as indicated by the 8b10b detector, and the timer has expired.

In some embodiments, not all of the aforementioned conditions may cause the sqckt#suppress signal to be asserted to logic. For example, if a SATA link does not support AHCI, condition (a) may be unnecessary.

The sqckt#suppress signal is unasserted to logic '0' under any of the following conditions:

a. The communication link has not been established (the link is not in the PHY Ready state), the link is in AHCI Listen mode and an LPDD feature is not enabled;

b. The communication link has been established (the link is in the PHY Ready state) and an OOB signal is anticipated as indicated by the 8b10b detector.

c. The communication link is about to enter a SATA power management state (Partial or Slumber); or d. The host or device is attempting to establish a communication link by starting an OOB signaling event.

In certain embodiments of the present invention, not all of the aforementioned conditions may cause the sqckt#suppress signal to be unasserted to logic '0'. For example, if a SATA link does not support AHCI, condition (a) may be unnecessary.

Figure 7:
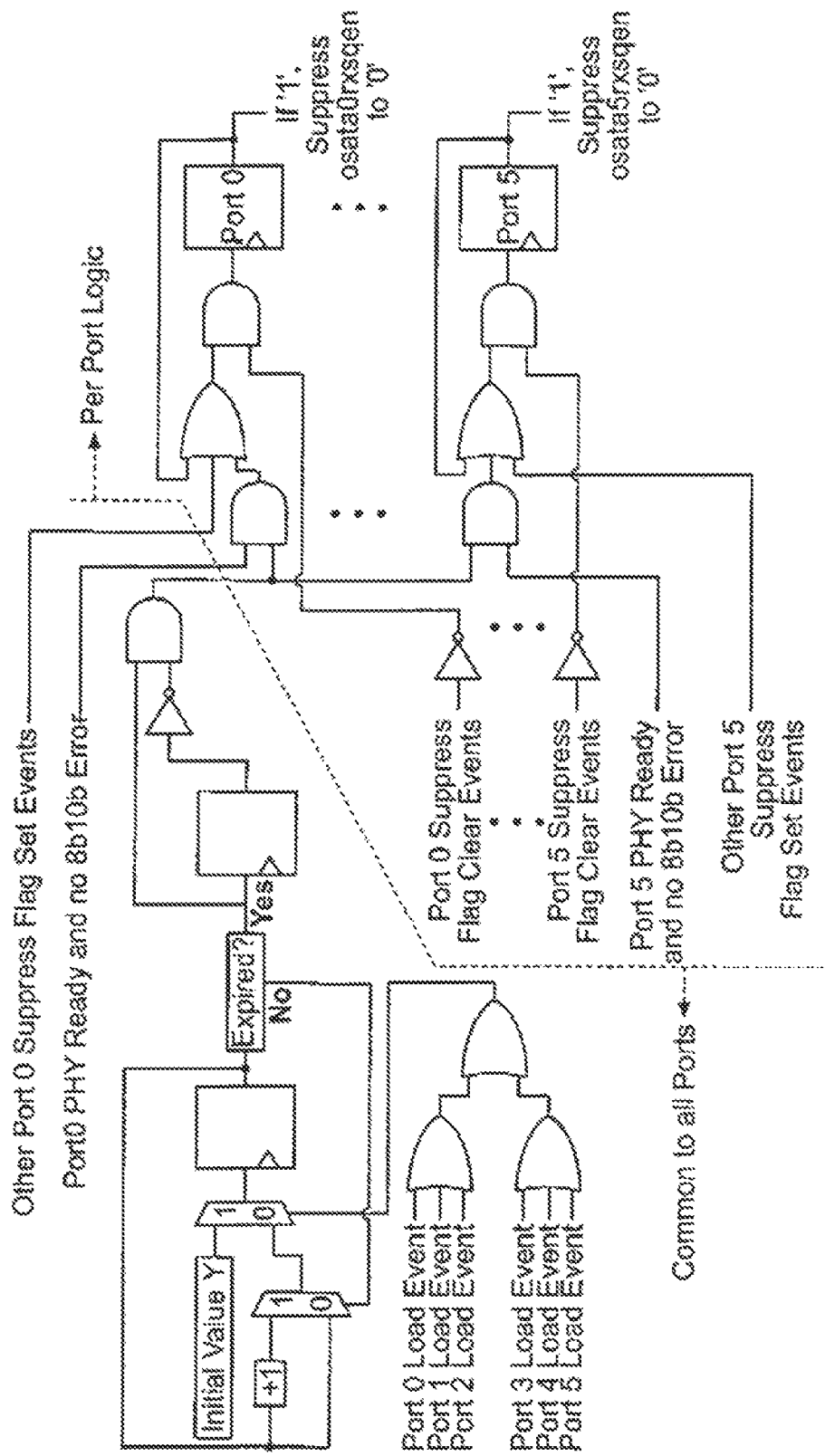
FIG. 7 shows an embodiment of a logic circuit capable of suppressing the osata#rxsqen signal according to an embodiment of the invention.

An embodiment of a logic circuit capable of suppressing the osata#rxsqen signal is illustrated in FIG. 7.

According to the SATA specification, after a SATA port is powered up and initialized, the squelch circuit will be turned on along with the link's transmitter and receiver circuitry. If a device is attached to the SATA port, a communication link is established between the host and the device after a series of OOB signaling events. Once the link is established, the link is said to be in the PHY Ready state. It has been determined that once the link is in the PHY Ready state, the squelch circuit which is responsible for OOB signal detection is no longer required and may be disabled. Once the link is in the PHY Ready state the squelch circuit may be disabled immediately or after a predetermined amount of time. The disabled squelch circuit may be enabled if there is an anticipated OOB signal.

As mentioned above, OOB signaling events can be anticipated if at least one 8b10b error is detected by the 8b10b Error Detector. The detection of an 8b10b error is selected as the OOB signal event indicator based on the following facts:
  a. Prior to the very first OOB burst that makes up the OOB signal, the receiver's differential inputs (sata#rxn and sata#rxp) will be driven to the common mode voltage level; and
  b. Two adjacent OOB bursts are separated by an idle period during which the received differential voltage level is at common mode.

In both cases, the common mode signal will be sampled as random logic '1's or '0's in the Digital Core Logic, which will eventually result in the 8b10b Error Detector indicating multiple 8b10b errors. When the 8b10b Error Detector asserts a signal indicating that an 8b10b error has occurred, the squelch circuit may be enabled if it is disabled. If the 8b10b errors were actual 8b10b encoding errors rather than errors caused by OOB signaling events, there is no harm in erroneously enabling the disabled squelch circuit. Eventually, the squelch circuit will be disabled again if the link is still in the PHY Ready state after the last 8b10b error.

Figure 8:
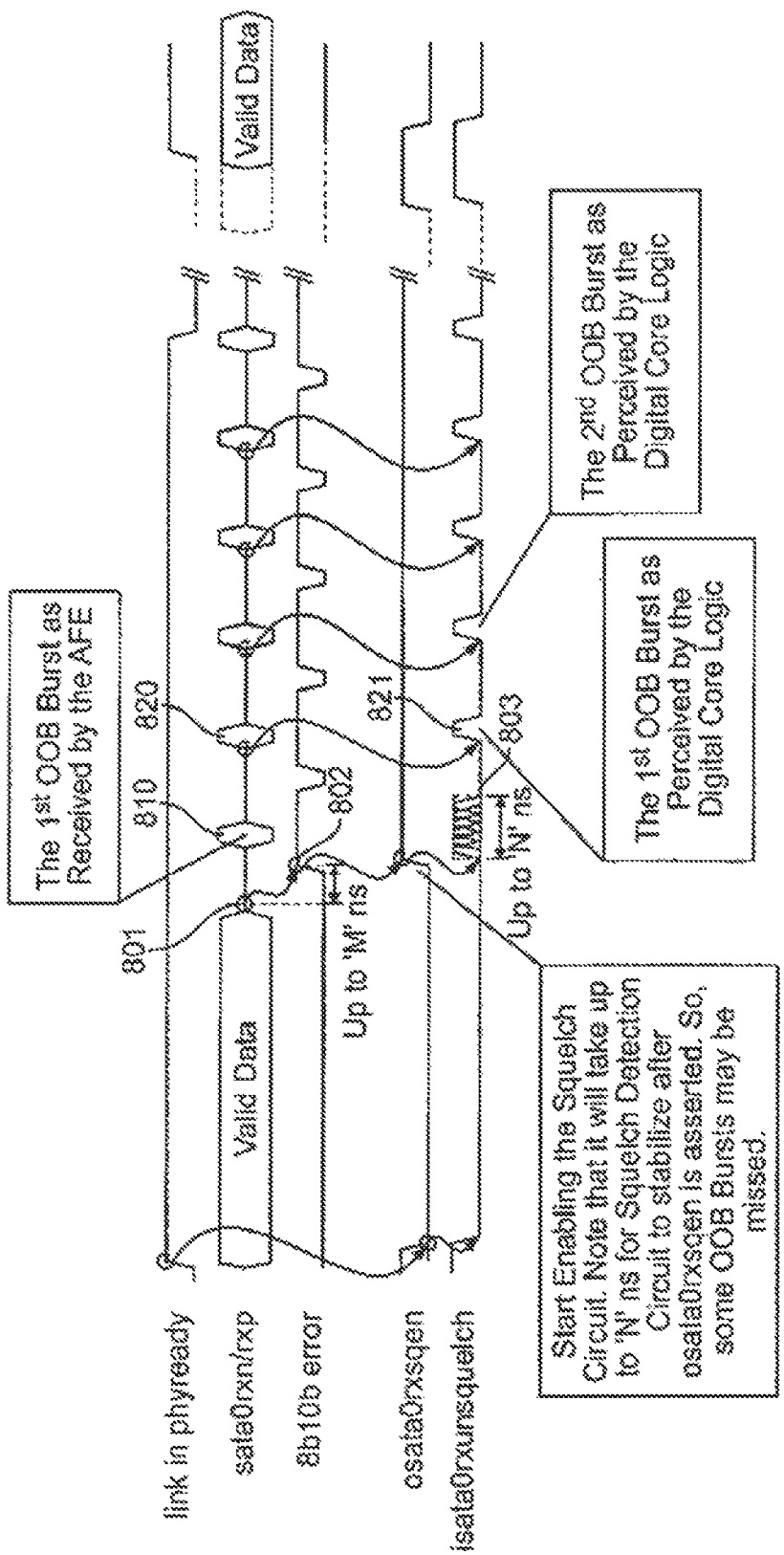
FIG. 8 shows a timing diagram indicating an embodiment of the present invention in which SATA link 0 is in the PHY Ready state with the squelch circuit already disabled when 8b10b errors occur due to OOB signaling events.
Figure 9:
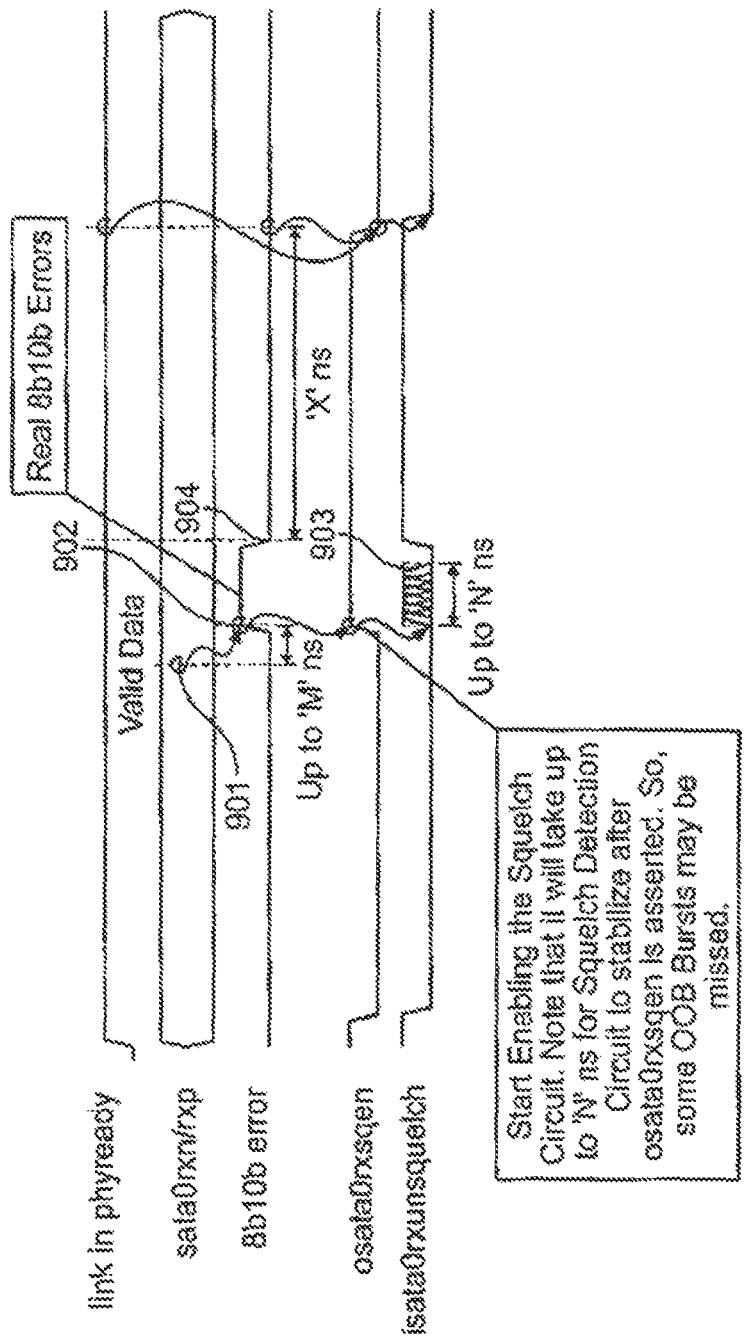
FIG. 9 shows a timing diagram indicating an embodiment of the present invention in which SATA link 0 is in the PHY Ready state with the squelch circuit already disabled when an 8b10b encoding error occurs which is not due to an OOB signaling event.

FIG. 8 is a timing diagram indicating an embodiment of the present invention in which SATA link 0 is in the PHY Ready state with the squelch circuit already disabled when 8b10b errors occur due to OOB signaling events. FIG. 9 is a timing diagram describing the behavior of an embodiment in which SATA link 0 is in the PHY Ready state with the squelch circuit already disabled when an 8b10b encoding error occurs which is not due to an OOB signaling event. In the figures, 'M' is the time between the first appearance on the receiver's differential inputs of an 8b10b error and the first appearance of an 8b10b error signal asserted by the 8b10b Error Detector; 'N' is the time taken for the disabled squelch circuit to stabilize and operate properly after being enabled; and 'X' is the time since an 8b10b error signal was last asserted.

In both figures, once an 8b10b error appears on the receiver's differential inputs, M time transpires until the 8b10b Error Detector asserts the 8b10b error signal which signals the Squelch Circuit On/Off Control to enable the disabled squelch circuit by unasserting the osata#rxsqen signal. Once the osata#rxsqen signal has been unasserted it takes N time for the squelch circuit to stabilize and begin accurately detecting OOB signals. The SATA specification states that an OOB detector shall look for a minimum of four consecutive OOB bursts to validate an OOB signal. Thus, although FIG. 2 indicates that the three types of OOB signals may consist of many more than four consecutive OOB bursts, the OOB detector is only required to receive a minimum of four bursts to properly detect an OOB signal. As defined by the SATA specification, the ComReset, ComInit, and ComWake signals each consist of at least six consecutive OOB bursts. Since at least four consecutive OOB bursts must be received, time M+N should be smaller than three consecutive OOB bursts (e.g., no more than two consecutive OOB bursts can be missed).

In FIG. 8 the timing diagram begins with the SATA link in the PHY Ready state and the squelch circuit disabled. At time 801 the differential inputs are first put into common mode. At time 802 the 8b10b Error Detector first asserts the 8b10b error signal which in turn causes the Squelch Circuit On/Off Control to unassert the osatagrxsqen signal in order to enable the squelch circuit. The time between 801 and 802 is M. At time 803 the squelch circuit is fully enabled and operating properly. The time between 802 and 803 is N. Although the first OOB burst 810 to appear on the differential inputs is missed by the OOB Detector circuit since it occurs before time 803, the second OOB burst 820 to appear on the differential inputs is detected, and shows up as the first detected OOB burst 821. Thus, the disabled squelch circuit is enabled before the second OOB burst ensuring that the OOB signal will be received properly (M+N is not greater than two OOB bursts).

In FIG. 9 the timing diagram begins with the SATA link in the PHY Ready state and the squelch circuit disabled. At time 901 an 8b10b encoding error first occurs on the differential inputs. At time 902 the 8b10b Error Detector first asserts the 8b10b error signal which in turn causes the Squelch Circuit On/Off Control to unassert the osata#rxsqen signal in order to enable the squelch circuit. The time between 901 and 902 is M. At time 903 the squelch circuit is fully enabled and operating properly. The time between 902 and 903 is N. At time 904 the 8b10b error signal is unasserted. Because there is only one 8b10b encoding error in this scenario, the 8b10b error signal is unasserted and remains unasserted. Time 904 is the starting time for time X. Once time X has elapsed it can be safely assumed that the 8b10b error was due to an encoding problem and not due to an OOB burst. After time X, if the SATA link is still in the PHY Ready state, the squelch circuit can be disabled again. Thus, the disabled squelch circuit is enabled in anticipation of an OOB signal, but is disabled again when it is determined that no OOB signal was received.

When a link is in AHCI Listen mode, no device has been detected as being connected to the host. Nonetheless, the host may continue to listen to (e.g., monitor) the received differential inputs for a ComInit so that it may detect a device's plug-in event and establish communication with the device. As such, the Squelch Circuit may only be shut down if there is a means available to indicate a device plug-in event to the host. When an LPDD device is enabled, a device's presence can be detected via a sensing mechanism. Even if a ComInit is not detected when the device is plugged in, the host will eventually be able to detect the device's existence via LPDD. Thus, if an LPDD feature is enabled, the squelch circuit may be safely disabled in AHCI Listen mode.

In an embodiment of the present invention 15 mW of power may be saved by disabling the squelch circuit. In another embodiment of the present invention, 9 mW may be saved by disabling the squelch circuit. Other benefits or power savings may occur.

When a link is in either the Partial or Slumber power states, or in AHCI Listen mode without an LPDD feature enabled, there is no reliable indicator available to determine if an OOB signaling event is taking place without the squelch circuit enabled. However, it is possible to achieve a degree of power saving.

It is possible to achieve a degree of power saving even when the SATA link is in Partial or Slumber power states or in AHCI Listen mode when no LPDD feature is enabled. As mentioned above, the SATA specification states that a minimum of four consecutive OOB bursts are necessary to validate an OOB signal as long as there is valid gap spacing between the bursts. Since each OOB signal consists of at least six consecutive OOB bursts it is possible to miss at most two OOB bursts and still correctly receive the OOB signal. This implies that the squelch circuit could be disabled for some time, then enabled again after some time and still ensure that no OOB signals are missed.

Thus, in an embodiment of the present invention the squelch circuit may be cyclically enabled and disabled when:
  a. The communication link is in AHCI Listen mode and an LPDD feature is disabled; or b. The communication link is in SATA Partial or Slumber power management states.

In order to cyclically enable and disable the squelch circuit, the following components may be necessary:

a. A power management state timer to determine the time elapsed since the link entered the Partial or Slumber power management state, the link entered AHCI Listen mode without LPDD being enabled, or since the timer last expired and was reinitialized; and b. A power management state suppression flag to disable the squelch circuit of a SATA communication link (e.g. by setting osata#rxsqen to logic '0') or enable the squelch circuit of the SATA communication link (e.g. by setting osata#rxsqen to logic '1').

There may be one power management timer per SATA link or one power management timer common to all SATA links. This timer may be initialized to Y time upon power up or upon coming out of reset. The timer may begin counting down as soon as the link has entered a SATA power management state (Partial or Slumber) or AHCI Listen mode if LPDD feature is disabled. Once the timer has expired, indicating that Y time has elapsed, the timer may be re-initialized with another time value Z. Alternately two timers may be used. After being re-initialized, the timer may start counting down again until it expires, upon which it may be re-initialized to Y time again. This process may continue as long as the link is still in a power management state or in AHCI Listen mode when no LPDD feature is enabled. As soon as the link is no longer in one of these states, the timer may be re-initialized to Y time.

The power management state suppression flag which disables the squelch circuit may be asserted (e.g. set to logic '1') if any of the following is true:

a. When the timer is triggered to count down Y time.

The power management state suppression flag which disables the squelch circuit may be unasserted (e.g. set to logic '0') if any of the following is true:

a. When the timer expires after Y time.

The longest time that the Squelch Circuit can be disabled (e.g. Y time) is determined by the shortest time taken for two OOB bursts minus the time taken for the squelch circuit to stabilize after being enabled. Because these values may be difficult to estimate, in some embodiments of the present invention Y may be made programmable so that it can be fine-tuned through real world experiments. As detailed in the SATA specification (see also FIG. 2), ComWake OOB bursts are shorter than ComInit and ComReset OOB bursts. Therefore, the calculation of Y should be based on ComWake. Y must be smaller than two series of ComWake OOB bursts and one ComWake idle period. However, the squelch circuit must be given time to stabilize after being enabled. Thus, Y must be smaller than two series of ComWake OOB bursts plus one ComWake idle period minus N. According to the SATA specification, the OOB detector is required to detect all ComWake burst idle periods of 106.7 ns nominal. The OOB detector is also required to detect all ComWake burst OOB bursts of 106.7 ns nominal. Thus, in an embodiment of the present invention Y is equal to at most 106.7 ns+106.7 ns+106.7 ns−N=320.1 ns−N.

The shortest time that the Squelch Circuit must be turned on (e.g., Z time) is determined by the longest time taken for four OOB bursts. In an embodiment of the present invention, Z may be made programmable so that it can be fine-tuned through real world experiments. Given that ComWake bursts are shorter than ComInit and ComReset bursts, the calculation should be based on ComInit and ComReset. Z must be larger than four series of ComInit/ComReset OOB bursts and four series of ComInit/ComReset idle periods. According to the SATA specification, the OOB detector is required to detect all ComInit/ComReset idle periods of 320 ns nominal. The OOB detector is also required to detect all ComInit/ComReset OOB bursts of 106.7 ns nominal. Thus, in an embodiment of the present invention Z is equal to at least 4*(320 ns+106.7 ns)=1706.8 ns.

With this kind of enable/disable pattern, the effective power saving is given by Y/(Y+Z). In an embodiment of the present invention, if N is 100 ns, an estimated 11.42% [(320.1 ns−100 ns)/(320.1 ns−100 ns+1706.8 ns)] of power saving can be achieved using this method.

Figure 10:
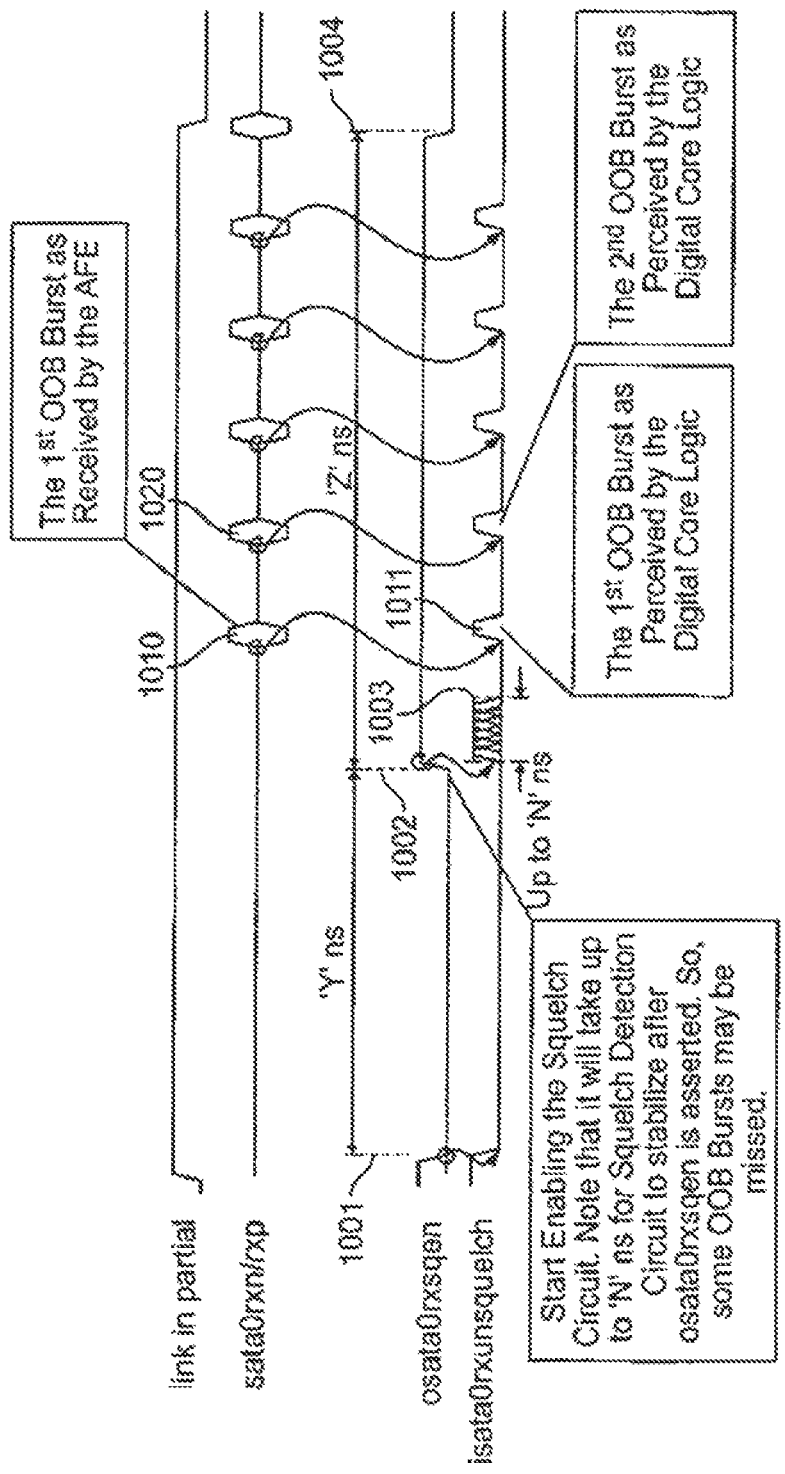
FIG. 10 is a timing diagram indicating an embodiment of the present invention in which SATA link 0 is in the Partial power management state with the squelch circuit being cyclically enabled and disabled.

FIG. 10 is a timing diagram indicating an embodiment of the present invention in which SATA link 0 is in the Partial power management state with the squelch circuit being cyclically enabled and disabled. At time 1001 the power management state timer is triggered to begin counting down Y time and thus the squelch circuit has been disabled. At time 1002 Y time has expired, the squelch circuit is enabled, and the timer begins counting down Z time. The time between 1001 and 1002 is Y. At time 1003 the squelch circuit is fully enabled and operating properly. The time between 1002 and 1003 is N. The first OOB burst 1010 appearing on the differential inputs is detected, and shows up as the first detected OOB burst 1011. Similarly, the second OOB burst 1020 is detected as OOB burst 1021. Although in this example the first actual OOB burst 1010 is the first detected OOB burst 1011 this may not necessarily be the case. However, due to the requirements imposed on Y and Z, it is guaranteed that eventually four consecutive OOB bursts will be detected. At time 1004 Z time has expired, the squelch circuit is disabled, and the timer begins counting down Y time again. The time between 1003 and 1004 is Z.

The table below summarizes the link conditions in which the squelch circuit should be enabled or disabled as the link transitions between various states, according to one embodiment:

|  | To | | | |
| --- | --- | --- | --- | --- |
| From | Transmit OOB Signal | PHY Ready | Partial or Slumber | AHCI Listen mode |
| Transmit OOB Signal | Enable squelch circuit when an OOB signal is about to be transmitted. | Enable squelch circuit when an OOB signal is anticipated as indicated by 8b10b error detection. Disable squelch circuit if link has been in PHY Ready state for a given | Illegal case. Cannot occur without the link first transitioning through the PHY Ready state. | Enable squelch circuit if LPDD is disabled. Disable squelch circuit if LPDD is enabled and link has been in Listen mode for a given time. If LPDD is not enabled, the squelch |

-continued

| From | To | | | |
|---|---|---|---|---|
| | Transmit OOB Signal | PHY Ready | Partial or Slumber | AHCI Listen mode |
| | | time and an unsolicited OOB signal is not anticipated as indicated by no 8b10b error. | | circuit may be cyclically enabled and disabled. |
| Phy Ready | Enable squelch circuit when an OOB signal is about to be transmitted. Note that, for example, if a ComReset is about to be sent due to an unsolicited ComInit, the squelch circuit would have already been enabled because a series of 8b10b errors would have been detected. | See above. | Enable squelch circuit as soon as a Partial or Slumber power management request has been made to the PHY layer. The squelch circuit may be cyclically enabled and disabled. | See above. |
| Partial or Slumber | Squelch circuit should have been enabled when the link state transitions from the PHY Ready state to Partial or Slumber state. Keep the squelch circuit enabled. The squelch circuit may be cyclically enabled and disabled. | See left. | See left. | See above. |
| AHCI Listen mode | This transition indicates leaving the AHCI Listen mode state in which a ComReset will eventually be triggered. Enable the squelch circuit when a ComReset is about to be sent. | Illegal case. Cannot occur without the link first transitioning through the Transmit OOB Signal state. | Illegal case. Cannot occur without the link first transitioning through the Transmit OOB Signal state and PHY Ready state. | See above. |

According to the SATA specification, an 8b10b Error Detector is mandatory in all SATA designs. The only requirement in one embodiment is that the 8b10b Error Detector must operate purely based on the raw data received by the Digital Logic Core after the APE without any other qualification (e.g. link is in the PHY Ready state). Because the necessary circuitry either currently exists in the SATA link (e.g., it is mandatory under the SATA or AHCI specification) or may be readily implemented in spare logic gates in the Digital Logic Core, some embodiments of the present invention may be implemented with only minor changes to existing SATA designs.

What is claimed is:

1. An apparatus comprising:
   circuitry to receive a serial advanced technology attachment (SATA) differential input signal pair;
   the circuitry to detect, based upon the SATA differential input signal pair, presence of a SATA out of band (OOB) signaling level;
   the circuitry to be selectively powered down, at least in part, for at most a maximum predetermined time period in such a manner as to maintain proper operation in accordance with a SATA standard and to permit proper detection of at least one anticipated OOB signal; and
   the at least one anticipated OOB signal being initiated by a host to one of:
   reset the SATA device; and
   change a power state of an adapter.

2. The apparatus of claim 1, wherein:
   the circuitry comprises at least one of:
   a squelch circuit; and
   OOB detection logic.

3. The apparatus of claim 1, wherein:
   the input signal pair is from one of:
   a SATA host; and
   a SATA input/output device.

4. The apparatus of claim 1, wherein:
   the SATA standard comprises SATA Specification Revision 2.6, published Feb. 2007.

5. The apparatus of claim 1, wherein:
   the circuitry is integrated, at least in part, in an adapter of a SATA device.

6. A method comprising:
   receiving, by circuitry, a serial advanced technology attachment (SATA) differential input signal pair;

detecting by the circuitry, based upon the SATA differential input signal pair, presence of a SATA out of band (OOB) signaling level;

selectively powering down, at least in part, the circuitry, for at most a maximum predetermined time period in such a manner as to maintain proper operation in accordance with a SATA standard and to permit proper detection of at least one anticipated OOB signal; and the at least one anticipated OOB signal being initiated by a host to one of:
  reset the SATA device; and
  change a power state of an adapter.

7. The method of claim 6, wherein:
the circuitry comprises at least one of:
  a squelch circuit; and
  OOB detection logic.

8. The method of claim 6, wherein:
the input signal pair is from one of:
  a SATA host; and
  a SATA input/output device.

9. The method of claim 6, wherein:
the SATA standard comprises SATA Specification Revision 2.6, published Feb. 2007.

10. The method of claim 6, wherein:
the circuitry is integrated, at least in part, in an adapter of a SATA device.

11. Computer-readable memory storing machine-readable program instructions that when executed by a machine results in operations comprising:
  receiving, by circuitry, a serial advanced technology attachment (SATA) differential input signal pair;
  detecting by the circuitry, based upon the SATA differential input signal pair, presence of a SATA out of band (OOB) signaling level;
  selectively powering down, at least in part, the circuitry, for at most a maximum predetermined time period in such a manner as to maintain proper operation in accordance with a SATA standard and to permit proper detection of at least one anticipated OOB signal; and
  the at least one anticipated OOB signal being initiated by a host to one of:
    reset the SATA device; and
    change a power state of an adapter.

12. The memory of claim 11, wherein:
the circuitry comprises at least one of:
  a squelch circuit; and
  OOB detection logic.

13. The memory of claim 11, wherein:
the input signal pair is from one of:
  a SATA host; and
  a SATA input/output device.

14. The memory of claim 11, wherein:
the SATA standard comprises SATA Specification Revision 2.6, published Feb. 2007.

15. The memory of claim 11, wherein:
the circuitry is integrated, at least in part, in an adapter of a SATA device.

16. An apparatus comprising:
circuitry to receive a serial advanced technology attachment (SATA) differential input signal pair;
the circuitry to squelch output of the circuitry based at least in part upon signaling level of the SATA differential input signal pair;
the circuitry to detect, based upon the SATA differential input signal pair, presence of a SATA out of band (OOB) signal;
the circuitry to be selectively powered down, at least in part, during an idle period of the SATA differential input signal pair; and
the circuitry to be selectively powered up, within at most a predetermined maximum time period following the idle period, in such a manner as to maintain proper operation in accordance with a SATA standard and to permit proper detection of at least one anticipated OOB signal.

17. The apparatus of claim 16, wherein:
the circuitry comprises at least one of:
  a squelch circuit; and
  OOB detection logic.

18. The apparatus of claim 16, wherein:
the input signal pair is from one of:
  a SATA host; and
  a SATA input/output device.

19. The apparatus of claim 16, wherein:
the SATA standard comprises SATA Specification Revision 2.6, published Feb. 2007.

20. The apparatus of claim 16, wherein:
the circuitry is integrated, at least in part, in an adapter of a SATA device; and
the at least one anticipated OOB signal is initiated by a host to reset the SATA device.

21. The apparatus of claim 16, wherein:
the circuitry is integrated, at least in part, in an adapter of a SATA device; and
the at least one anticipated OOB signal is initiated by a host to change a power state of the adapter.

22. The apparatus of claim 16, wherein:
the circuitry is integrated, at least in part, in an adapter of a host; and
the at least one anticipated OOB signal is initiated by a SATA device to request communication initialization from the host.

23. A method comprising:
receiving, by circuitry, a serial advanced technology attachment (SATA) differential input signal pair;
squelching, by the circuitry, output of the circuitry based at least in part upon signaling level of the SATA differential input signal pair;
detecting, by the circuitry, based upon the SATA differential input signal pair, presence of a SATA out of band (OOB) signal;
selectively powering down the circuitry, at least in part, during an idle period of the SATA differential input signal pair; and
selectively powering up the circuitry, within at most a predetermined maximum time period following the idle period, in such a manner as to maintain proper operation in accordance with a SATA standard and to permit proper detection of at least one anticipated OOB signal.

24. The method of claim 23, wherein:
the circuitry comprises at least one of:
  a squelch circuit; and
  OOB detection logic.

25. The method of claim 23, wherein:
the input signal pair is from one of:
  a SATA host; and
  a SATA input/output device.

26. The method of claim 23, wherein:
the SATA standard comprises SATA Specification Revision 2.6, published Feb. 2007.

27. The method of claim 23, wherein:
the circuitry is integrated, at least in part, in an adapter of a SATA device; and the at least one anticipated OOB signal is initiated by a host to reset the SATA device.

28. The method of claim 23, wherein:
the circuitry is integrated, at least in part, in an adapter of a SATA device; and
the at least one anticipated OOB signal is initiated by a host to change a power state of the adapter.

29. The method of claim 23, wherein:
the circuitry is integrated, at least in part, in an adapter of a host; and
the at least one anticipated OOB signal is initiated by a SATA device to request communication initialization from the host.

30. Computer-readable memory storing machine-readable program instructions that when executed by a machine results in operations comprising:
receiving, by circuitry, a serial advanced technology attachment (SATA) differential input signal pair;
squelching, by the circuitry, output of the circuitry based at least in part upon signaling level of the SATA differential input signal pair;
detecting, by the circuitry, based upon the SATA differential input signal pair, presence of a SATA out of band (OOB) signal;
selectively powering down the circuitry, at least in part, during an idle period of the SATA differential input signal pair; and
selectively powering up the circuitry, within at most a predetermined maximum time period following the idle period, in such a manner as to maintain proper operation in accordance with a SATA standard and to permit proper detection of at least one anticipated OOB signal.

31. The memory of claim 30, wherein:
the circuitry comprises at least one of:
a squelch circuit; and
OOB detection logic.

32. The memory of claim 30, wherein:
the input signal pair is from one of:
a SATA host; and
a SATA input/output device.

33. The memory of claim 30, wherein:
the SATA standard comprises SATA Specification Revision 2.6, published Feb. 2007.

34. The memory of claim 30, wherein:
the circuitry is integrated, at least in part, in an adapter of a SATA device; and
the at least one anticipated OOB signal is initiated by a host to reset the SATA device.

35. The memory of claim 30, wherein:
the circuitry is integrated, at least in part, in an adapter of a SATA device; and
the at least one anticipated OOB signal is initiated by a host to change a power state of the adapter.

36. The memory of claim 30, wherein:
the circuitry is integrated, at least in part, in an adapter of a host; and
the at least one anticipated OOB signal is initiated by a SATA device to request communication initialization from the host.

* * * * *